(12) United States Patent
Kan (10) Patent No.: US 7,039,880 B2
(45) Date of Patent: May 2, 2006

(54) CIRCUIT DESIGN METHOD, APPARATUS AND PROGRAM USING POLYNOMIAL PRIMITIVE ROOT

(75) Inventor: Makiko Kan, Tokyo (JP)

(73) Assignee: Sony Corporation, Tokyo (JP)

( * ) Notice: Subject to any disclaimer, the term of this patent is extended or adjusted under 35 U.S.C. 154(b) by 247 days.

(21) Appl. No.: 10/706,811

(22) Filed: Nov. 12, 2003

(65) Prior Publication Data

US 2004/0098679 A1    May 20, 2004

(30) Foreign Application Priority Data

Nov. 14, 2002   (JP) ............................ P2002-330569

(51) Int. Cl.
*G06F 17/50* (2006.01)
(52) U.S. Cl. ................... 716/2; 716/1; 716/7
(58) Field of Classification Search .................. 716/1, 716/2, 7; 708/492

See application file for complete search history.

(56) References Cited

U.S. PATENT DOCUMENTS 6,687,725 B1 *   2/2004   Chen et al. ................. 708/492

* cited by examiner

*Primary Examiner*—Thuan Do
(74) *Attorney, Agent, or Firm*—Sonnenschein Nath & Rosenthal LLP (57) ABSTRACT

A circuit design method able to design a processing circuit for processing a finite field with fewer circuit design elements and in a smaller-size than the past comprising obtaining a first primitive root $\alpha_1$ on the basis of a first polynomial for a first extension from a first finite field to a second finite field, obtaining a second primitive root $\alpha_2$ on the basis of a second polynomial for a second extension from the second finite field to a third finite field, wherein a coefficient of a 0-th term is defined using the first primitive root $\alpha_1$ obtained above and the coefficient of the 0-th term of the first polynomial, defining processing on the third finite field using a base expressed using the second primitive root $\alpha_2$, and designing the processing circuit for performing that processing.

7 Claims, 6 Drawing Sheets

CIRCUIT DESIGN METHOD, APPARATUS AND PROGRAM USING POLYNOMIAL PRIMITIVE ROOT

BACKGROUND OF THE INVENTION

1. Field of the Invention

The present invention relates to a method, apparatus, and program for designing a processing circuit for performing processing on a finite field.

2. Description of the Related Art

For example, in error correction coding and decoding of the Hamming code etc., for example, processing is performed on a finite field.

Such a finite field is sometimes defined by extension from another finite field.

For example, where a second finite field is defined by a first extension from a first finite field and a third finite field is defined by a second extension from the second finite field, the processing on the third finite field is defined using the processing on the second finite field.

Further, the processing on the second finite field is expressed using a base determined on the basis of a primitive root obtained by a first polynomial for the first extension. Further, the processing on the second finite field is expressed using a base determined on the basis of a primitive root obtained by a second polynomial for the second extension.

In the conventional circuit design method, a coefficient of the 0-th term of the second polynomial is set without regard as to the coefficient of the 0-th term of the first polynomial.

Summarizing the problem to be solved by the invention, in the conventional circuit design method explained above, the number of circuit design elements of the processing circuit for processing on the third finite field becomes large, so the processing circuit ends up becoming large in scale.

SUMMARY OF THE INVENTION

An object of the present invention is to provide a circuit design method, apparatus, and program able to design a processing circuit for processing on a finite field with fewer circuit design elements and in a smaller size than the past and such a processing circuit.

To attain the above object, according to a first aspect of the present invention, there is provided a circuit design method executed by a computer for designing a processing circuit for processing on a finite field comprising a first step of obtaining a first primitive root $\alpha_1$ on the basis of a first polynomial for a first extension from a first finite field to a second finite field; a second step of obtaining a second primitive root $\alpha_2$ on the basis of a second polynomial for a second extension from the second finite field to a third finite field, in which a coefficient of a 0-th term is defined using the first primitive root $\alpha_1$ obtained in the first step and the coefficient of the 0-th term of the first polynomial; a third step of defining the processing on the third finite field using a base expressed using the second primitive root $\alpha_2$ obtained in the second step; and a fourth step of designing a processing circuit for the related processing on the basis of the processing defined in the third step.

The mode of operation of the circuit design method of the first aspect of the invention therefore becomes as follows.

First, in the first step, a first primitive root a is obtained on the basis of a first polynomial for a first extension from a first finite field to a second finite field.

Next, in the second step, a second primitive root $\alpha_2$ is obtained on the basis of a second polynomial for a second extension from the second finite field to a third finite field, in which the coefficient of the 0-th term is defined using the first primitive root $\alpha_1$ obtained in the first step and the coefficient of the 0-th term of the first polynomial.

Next, in the third step, processing on the third finite field is defined using a base expressed by using the second primitive root $\alpha_2$ obtained in the second step.

Next, in the fourth step, on the basis of the processing defined in the third step, a processing circuit for the related processing is designed.

According to a second aspect of the present invention, there is provided a circuit design apparatus for designing a processing circuit for processing on a finite field comprising: a first means for obtaining a first primitive root $\alpha_1$ on the basis of a first polynomial for a first extension from a first finite field to a second finite field; a second means for obtaining a second primitive root $\alpha_2$ on the basis of a second polynomial for a second extension from the second finite field to a third finite field, in which a coefficient of a 0-th term is defined using the first primitive root $\alpha_1$ obtained by the first means and the coefficient of the 0-th term of the first polynomial; a third means for defining processing on the third finite field using a base expressed using the second primitive root $\alpha_2$ obtained by the second means; and a fourth means for designing a processing circuit for the related processing on the basis of the processing defined by the third means.

The mode of operation of the circuit design apparatus of the second aspect of the invention becomes as follows.

First, in the first means, a first primitive root $\alpha_1$ is obtained on the basis of a first polynomial for a first extension from a first finite field to a second finite field.

Next, in the second means, a second primitive root $\alpha_2$ is obtained on the basis of a second polynomial for a second extension from the second finite field to a third finite field, in which the coefficient of a 0-th term is defined using the first primitive root $\alpha_1$ obtained by the first means and the coefficient of the 0-th term of the first polynomial.

Next, in the third means, processing on the third finite field is defined using a base expressed by using the second primitive root $\alpha_2$ obtained by the second means.

Next, in the fourth means, on the basis of the processing defined in the third means, a processing circuit for the related processing is designed.

According to a third aspect of the present invention, there is provided a program executed by the circuit design apparatus for designing a processing circuit for processing on a finite field comprising a first routine of obtaining a first primitive root $\alpha_1$ on the basis of a first polynomial for a first extension from a first finite field to a second finite field; a second routine of obtaining a second primitive root $\alpha_2$ on the basis of a second polynomial for a second extension from the second finite field to a third finite field, in which a coefficient of a 0-th term is defined using the first primitive root $\alpha_1$ obtained in the first routine and the coefficient of the 0-th term of the first polynomial; a third routine of defining processing on the third finite field using a base expressed using the second primitive root $\alpha_2$ obtained in the second routine; and a fourth routine of designing a processing circuit for the related processing on the basis of the processing defined in the third routine.

BRIEF DESCRIPTION OF THE DRAWINGS

The above object and features of the present invention will be more apparent from the following description of the preferred embodiments given with reference to the accompanying drawings, wherein.

DESCRIPTION OF THE PREFERRED EMBODIMENTS

Related Art of Invention

As a related art, for reference, an explanation will be given of a circuit design method for designing a processing circuit for processing on a finite field L including a-times multiprocessing on a finite field K in a case where a finite field F is an n-th extension of a finite field $F_q$, a finite field K is an extension of the extension order q from the finite field F, and a finite field L is an extension of the extension order q from the finite field K.

Here, the order is indicated by the following (1-1), and the finite field L is expressed as in the following (1-2). In the present embodiment, in the following (1-1) and (1-2), a case where $l_1 = l_2 = q$ is exemplified.

$$q^{n \cdot l_1 \cdot l_2} \ (q = p^m, \ p: \text{prime number}, \ n, \ l_1, \ l_2, \ m: \text{natural numbers}) \tag{1-1}$$

$$L := F_{q^{n \cdot l_1 \cdot l_2}} \tag{1-2}$$

In this case, the relationships of the above extensions are indicated by the following (1-3):

(1-3)

Figure 1:
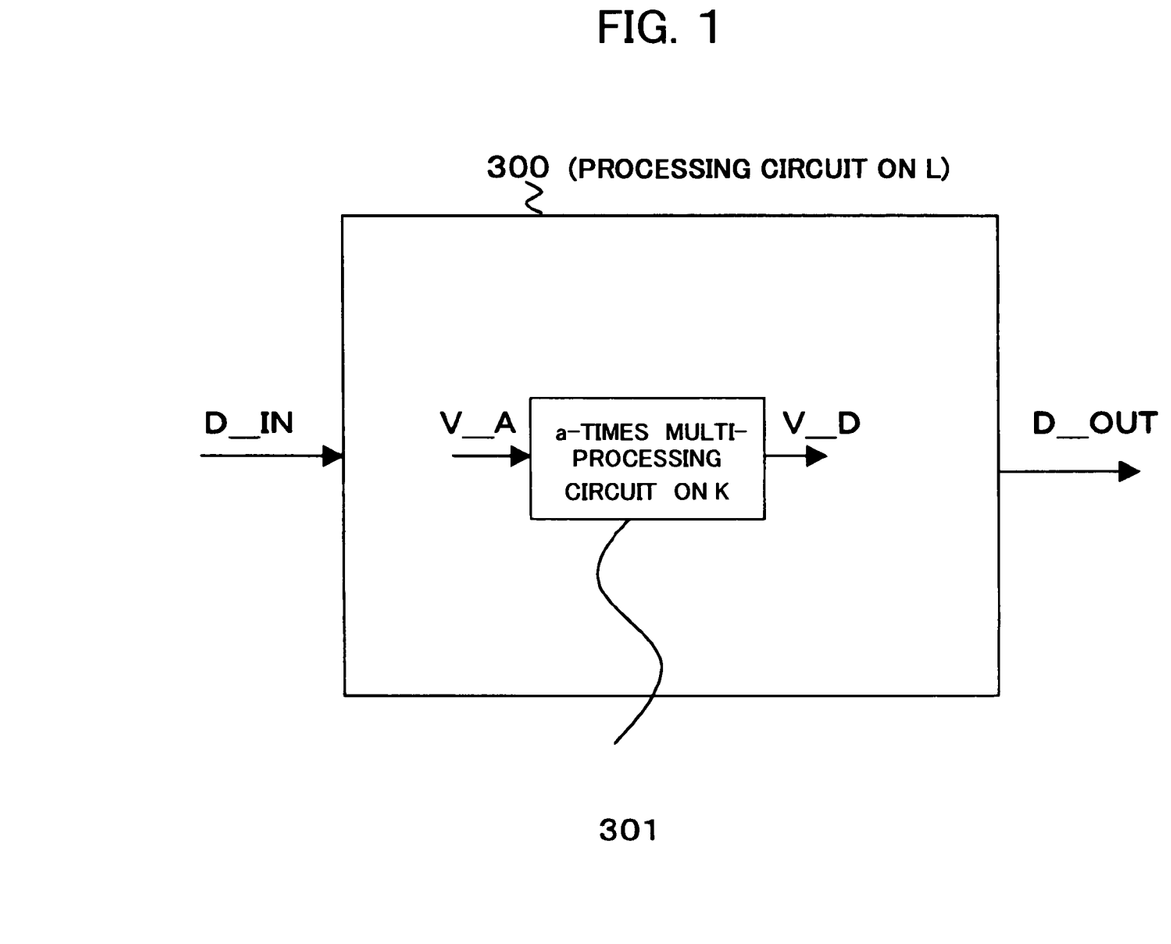
FIG. 1 is a view for explaining a processing circuit for processing on a finite field L designed by a circuit design method of the related art of the present invention.

In the related circuit design method, as shown in FIG. 1, a processing circuit 300 receiving as input an $l_2$-th dimensional vector D_IN on the finite field K, outputting an $l_2$-th dimensional vector D_OUT on the finite field K, having an a-times multiprocessing circuit 301 on the finite field K, and processing on the finite field L is designed.

The a-times multiprocessing circuit 301 on the finite field K receives as input an $l_1$-th dimensional vector VA on the finite field F and outputs an $l_1$-th dimensional vector VD on the finite field F.

A primitive root $\alpha_1$ of the first extension K/F from the finite field F to the finite field K is obtained on the basis of a first polynomial shown in the following (1-4):

$$\alpha_1 : \alpha_1^q - \alpha_1 + c = 0, \ \exists c \in Fs.t. Tr_{F_q}^F(c) \neq 0, \tag{1-4}$$

Then, the base of the processing on the finite field K is selected on the basis of the primitive root $\alpha_1$.

Further, a primitive root $\alpha_2$ of the second extension L/K from the finite field K to the finite field L is obtained on the basis of a second polynomial shown in the following (1-5).

$$\alpha_2 : \alpha_2^q - \alpha_2 + a = 0, \ \exists a = d \cdot \alpha_1^i \in K, \ i \in Zs.t. Tr_{F_q}^K(\alpha_1^i) \neq 0, \tag{1-5}$$

Then, the base of the processing on the finite field L is selected on the basis of the primitive root $\alpha_2$.

Here, the "a" of the a-times multiprocessing circuit 301 is the coefficient "a" of the 0-th term in (1-5).

Then, any dimension A on the finite field K shown in the following (1-6) using the base determined on the basis of the above primitive root $\alpha_1$ is shown by the $l_1(=q)$-th dimensional vector VA on the finite field F as in the following (1-7):

$$A: A_0 + A_1 \alpha_1 + A_2 \alpha_1^2 + \ldots + A_{q-1} \alpha_1^{q-1} \tag{1-6}$$

$$VA := (A_0, A_1, A_2, \ldots, A_{q-1}) \tag{1-7}$$

Further, D shown by the following (1-8) using the base determined on the basis of the above primitive root $\alpha_1$ is shown by the $l_1(=q)$-th dimensional vector VD on the finite field F as in the following (1-9):

$$D := a \cdot A = D_0 + D_1 \alpha_1 + D_2 \alpha_1^2 + \ldots + D_{q-1} \alpha_1^{q-1} \tag{1-8}$$

$$VD := (D_0, D_1, D_2, \ldots, D_{q-1}) \tag{1-9}$$

In this case, $D := a \cdot A$ becomes as shown in the following (1-10) and the vector VD becomes as shown in the following (1-11) when using "a" defined by the above (1-5) and A defined by the above (1-6). Here, the "q" power of $\alpha_1$ of the left side of the following (1-12) is expressed replaced by the value $(\alpha_1 - 1)$ of the right side.

$$-cd \cdot A_{q-i} \cdot \alpha_1^0 + \sum_{k=1}^{i-1} \{(d \cdot A_{k+q-i-1} - cd \cdot A_{k+q\ldots i}) \cdot \alpha_1^k\} + \tag{1-10}$$

$$d(A_0 + A_{q-1}) \cdot \alpha_1^i + d \sum_{k=i+1}^{q-1} \{A_{k-i} \cdot \alpha_1^k\}$$

$$\{-cdA_{q-i}, \ dA_{1+q-i-1} - cdA_{1+q-i}, dA_{2+q-i-1} - \tag{1-11}$$

$$cdA_{2+q-i}, \ldots, dA_{i-1+q-i-1} - cdA_{i-1+q-i}, d(A_0 + A_{q-1}),$$

$$dA_{i+1-i}, \ dA_{i+2-i}, \ldots dA_{q-1-i}\}$$

$$\alpha_1^q = \alpha_1 - c \tag{1-12}$$

Figure 2:
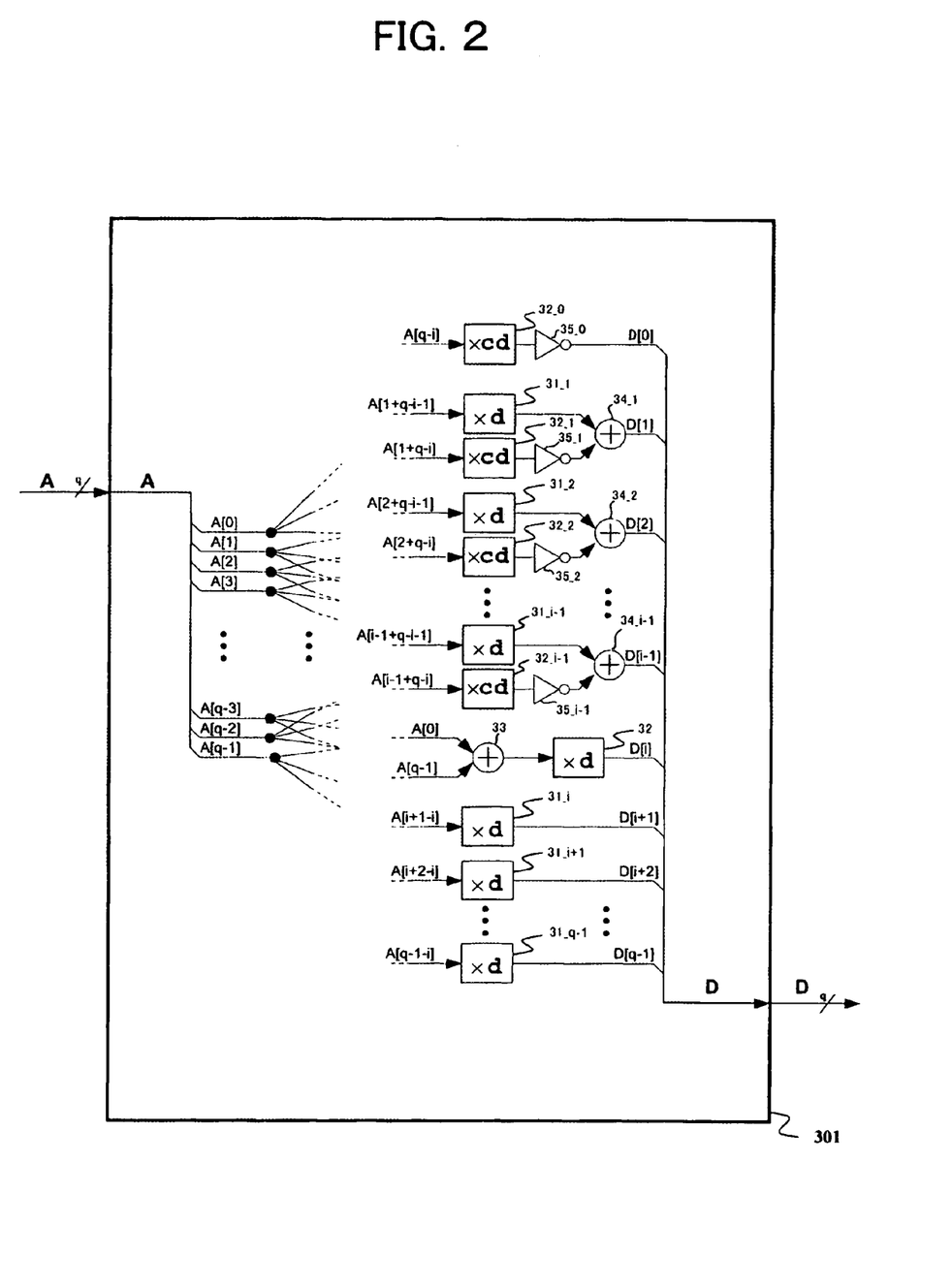
FIG. 2 is a view of the configuration of an a-times multiprocessing circuit on a finite field K shown in FIG. 1.

In the above circuit design method, as shown in FIG. 2, the a-times multiprocessing circuit 301 on the finite field K shown in FIG. 1 is designed on the basis of above (1-10) and (1-11).

The a-times multiprocessing circuit 301 shown in FIG. 2 has input to it the q-th dimensional vector VA shown in the above (1-7).

A[0] to A[q−1] shown in FIG. 2 correspond to $A_0$ to $A_{q-1}$ shown in the above (1-7).

The a-times multiprocessing circuit 301 is designed so as to perform the processing shown in the above (1-10) by replacing the q-th term of $\alpha_1$ by the first and the 0-th terms on the basis of (1-12) obtained from (1-4).

Due to this, the a-times multiprocessing circuit 301 is designed so as to perform processing for the coefficient of less than the q-th term of $\alpha_1$.

As shown in FIG. 2, the above circuit design method designs the a-times multiprocessing circuit 301 so that data A[0] to A[q−1] are input to the corresponding circuits among the q−1 number of multiplier circuits 31__1 to 31_q−1 for multiplying with the coefficient "d", the i−1 number of multiplier circuits 32__1 to 32__i−1 for multiplying with the coefficient cd, and an adder circuit 33.

Further, the above circuit design method designs the a-times multiprocessing circuit 301 so that the outputs of the multiplier circuits 32_0 to 32_i−1 are input to inverters 35_0 to 35_i−1.

Further, the above circuit design method designs the a-times multiprocessing circuit 301 so that the outputs of the multiplier circuits 31_1 to 31_i−1 are input to adder circuits 34_1 to 34_i−1.

Further, the above circuit design method designs the a-times multiprocessing circuit 301 so that the outputs of the inverters 35_1 to 35_i−1 are input to the adder circuits 34_1 to 34_i−1.

Further, the above circuit design method designs the a-times multiprocessing circuit 301 so that the output of the multiplier circuit 33 is input to the multiplier circuit 32 for multiplying with the coefficient "d".

Then, the outputs of the inverter 35_0, the adder circuits 34_1 to 34_i−1, the multiplier circuit 32, and the multiplier circuits 31_i to 31_q−1 become the data D[0] to D[q−1].

D[0] to D[q−1] shown in FIG. 2 correspond to $D_0$ to $D_{q-1}$ shown in the above (1-9) and (1-11).

Embodiments of the Invention

In the present embodiment, in the same way as the related art, an explanation will be given of a circuit design method for designing a processing circuit for processing a finite field L including a-times multiprocessing on a finite field K in the case where a finite field F (first finite field of the present invention) is an n-th extension of the finite field $F_q$, the finite field K (second finite field of the present invention) is an extension of an extension order "q" from the finite field F, and the finite field L (third finite field of the present invention) is an extension of the extension order "q" from the finite field K.

Here, the order is indicated by (2-1), and the finite field L is expressed as in the following (2-2). In the present embodiment, in the following (2-1) and (2-2), the case where $l_1 = l_2 = q$ will be exemplified. For example, "q" is 2, and "n" is 4.

$$q^{n \cdot l_1 \cdot l_2} (q = p^m, \ p: \text{prime number, n, } l_1, l_2, m: \text{natural numbers}) \quad (2\text{-}1)$$

$$L := F_{q^{n \cdot l_1 \cdot l_2}} \quad (2\text{-}2)$$

In this case, the relationships of the above extensions are indicated by the following (2-3):

$$\underset{C}{(F_q \text{ dimensional})} \overset{\text{n-th}}{F} \underset{C}{\overset{q\text{-th}}{\underset{\text{extension}}{\text{dimensional}}}} K \underset{C}{\overset{q\text{-th}}{\underset{\text{extension}}{\text{dimensional}}}} L \quad (2\text{-}3)$$

Figure 3:
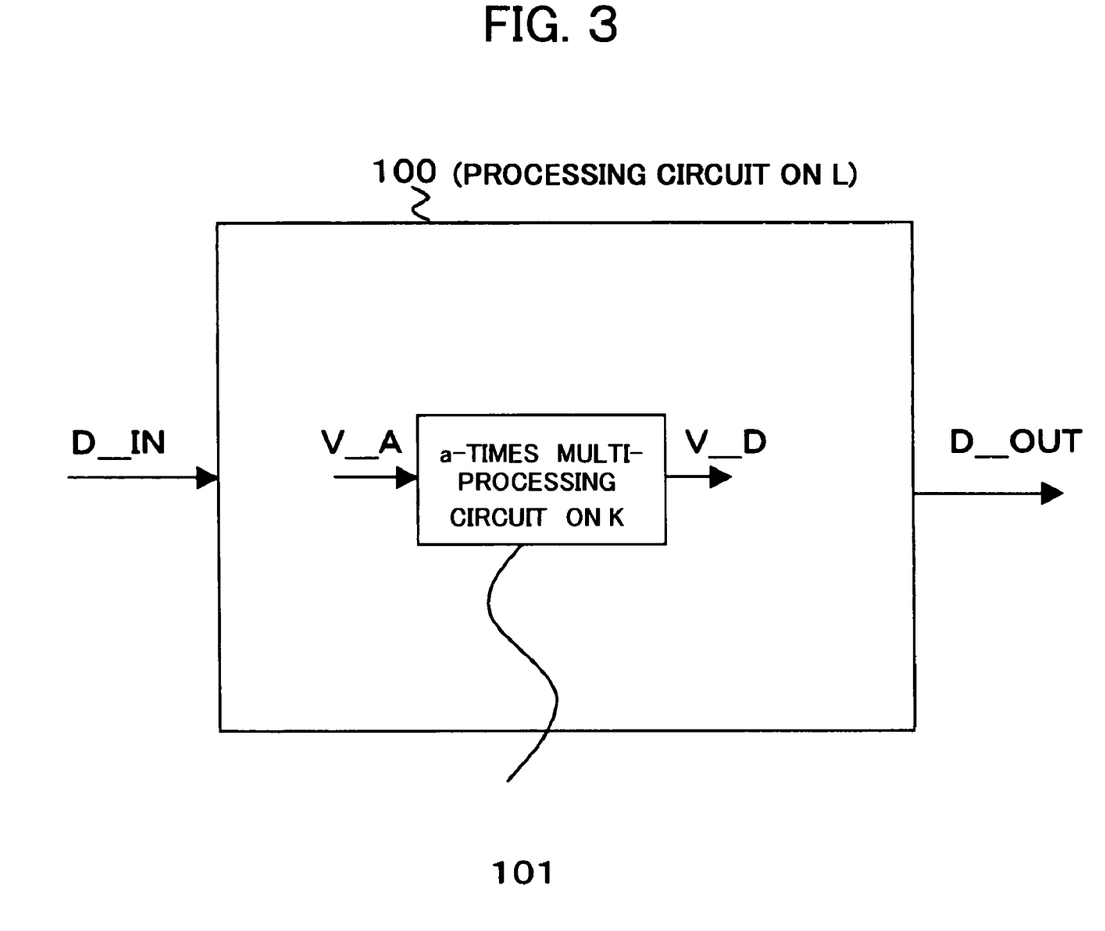
FIG. 3 is a view for explaining a processing circuit for processing on a finite field L designed by a circuit design method of an embodiment of the present invention.

In the circuit design method of the present embodiment, as shown in FIG. 3, a processing circuit 100 receiving as input the $l_2(=q)$-th dimensional vector D_IN on the finite field K, outputting the $l_2$-th dimensional vector D_OUT on the finite field K, having the a-times multiprocessing circuit 101 on the finite field K, and performing processing on the finite field L is designed.

The a-times multiprocessing circuit 101 on the finite field K receives as input the $l_1(=q)$-th dimensional vector VA on the finite field F and outputs the $l_1$-th dimensional vector VD on the finite field F.

The first primitive root $\alpha_1$ (first primitive root of the present invention) of the first extension K/F (first extension of the present invention) from the finite field F to the finite field K is obtained on the basis of the first polynomial shown in the following (2-4):

$$\alpha_1 : \alpha_1^q - \alpha_1 + c = 0, \ \exists c \in F \text{ s.t. } Tr_{F_q}^F(c) \neq 0, \quad (2\text{-}4)$$

Then, the base of the processing on the finite field K is selected on the basis of the primitive root $\alpha_1$.

In the above (2-4), a trace Tr is defined as in the following (2-4a).

$$Tr_{F_q}^F(c) := c + c^q + c^{q^2} + c^{q^3} + \ldots + c^{q^{n-1}} \quad (2\text{-}4a)$$

Further, the second primitive root $\alpha_2$ (second primitive root of the present invention) of the second extension L/K (second extension of the present invention) from the finite field K to the finite field L is obtained on the basis of the second polynomial (second polynomial of the present invention) shown in the following (2-5).

$$\alpha_2 : \alpha_2^q - \alpha_2 + a = 0, \ \exists a = c^{-1} \cdot \alpha_1^i \in K, \ i \in Zs.t. Tr_{F_q}^K(\alpha_1^i) \neq 0, \quad (2\text{-}5)$$

Here, in the second polynomial shown in (2-5), the coefficient "a" of the 0-th term is defined by using the first primitive root $\alpha_1$ of the first polynomial shown in the above (2-4) and the coefficient "c" of the 0-th term of the first polynomial.

Then, the dimension A on the finite field K shown in the following (2-6) using the base determined on the basis of the first primitive root $\alpha_1$ is shown by the $l_1$-th dimensional vector VA on the finite field F as in the following (2-7).

$$A : A_0 + A_1 \alpha_1 + A_2 \alpha_1^2 + \ldots + A_{q-1} \alpha_1^{q-1} \quad (2\text{-}6)$$

$$VA := (A_0, A_1, A_2, \ldots, A_{q-1}) \quad (2\text{-}7)$$

Further, D shown in the following (2-8) using the base determined on the basis of the above first primitive root $\alpha_1$ is indicated by the $l_1$-th dimensional vector VD on the finite field F as in the following (2-9):

$$D := a \cdot A = D_0 + D_1 \alpha_1 + D_2 \alpha_1^2 + \ldots + D_{q-1} \alpha_1^{q-1} \quad (2\text{-}8)$$

$$VD := (D_0, D_1, D_2, \ldots D_{q-1}) \quad (2\text{-}9)$$

In this case, when using "a" defined by the above (2-5) and A defined by the above (2-6), $D := a \cdot A$ becomes as shown in the following (2-10), and the vector V_D becomes as shown by the following (2-11). Here, the "q" power of $\alpha_1$ of the left side of the following (2-12) obtained from the above (2-4) is expressed replaced by the value ($\alpha_1 - 1$) of the right side.

$$D := a \cdot A \quad (2\text{-}10)$$

$$= -A_{l_1\_i} \cdot \alpha_1^0 + \sum_{k=1}^{i-1} \{(c^{-1} \cdot A_{k+l_1-i-1} - A_{k+l_1-i}) \cdot \alpha_1^k\} +$$

$$c^{-1}(A_0 + A_{l_1-1}) \cdot \alpha_1^i + c^{-1} \sum_{k=i+1}^{l_1-1} \{A_{k-i} \cdot \alpha_1^k\}.$$

$$(-A_{l_1\_i}, c^{-1}A_{1+l_1-i-1} - A_{1+l_1-i}, c^{-1}A_{2+l_1-i-1} - \quad (2\text{-}11)$$
$$A_{2+l_1-i}, \ldots, c^{-1}A_{i-1+l_1-i-1} - A_{i-1+l_1-i}, c^{-1}(A_0 + A_{l_1-1}),$$
$$c^{-1}A_{i+1-i}, c^{-1}A_{i+2-i}, \ldots, c^{-1}A_{l_1-1-i})$$

$$\alpha_1^q = \alpha_1 - c \quad (2\text{-}12)$$

In the above circuit design method, as shown in FIG. 1, the a-times multiprocessing circuit 101 on the finite field K is designed on the basis of above (2-10) and (2-11).

Here, "a" of the a-times multiprocessing circuit 101 is the "a" in the above (2-5).

Figure 4:
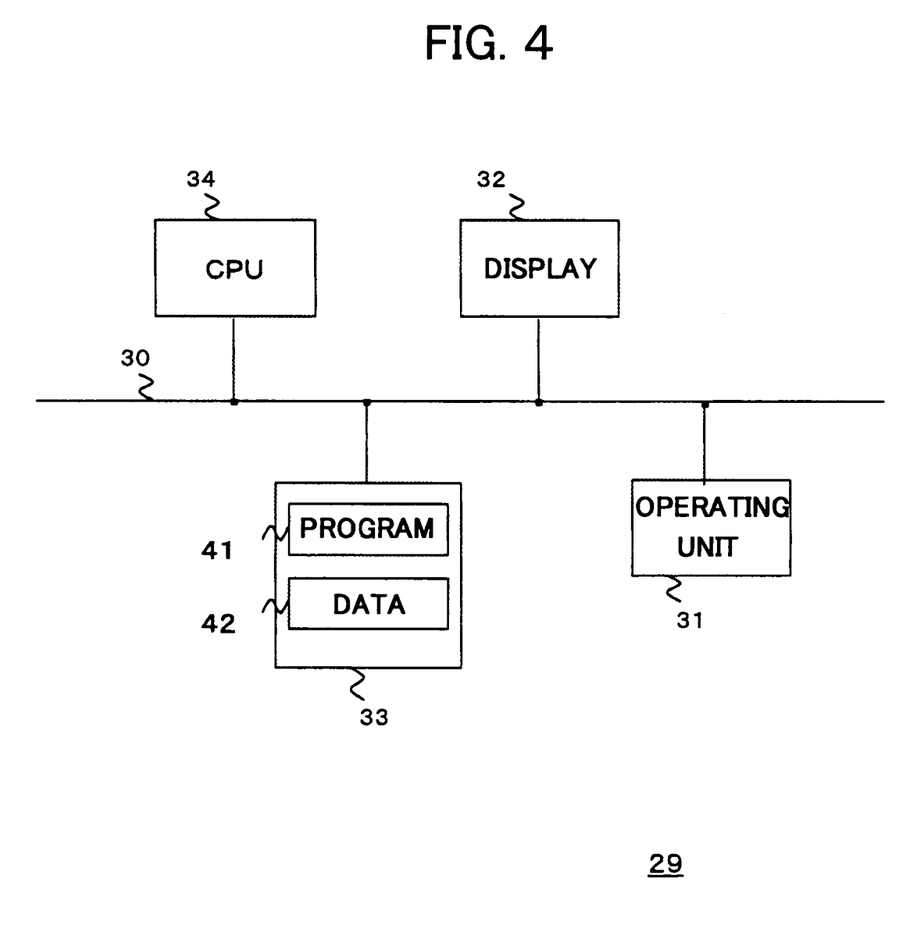
FIG. 4 is a view for explaining a computer for executing the circuit design method of the embodiment of the present invention.

FIG. 4 is a view of the configuration of a computer 29 (circuit design apparatus of the present invention) for executing the circuit design method of the present embodiment.

As shown in FIG. 4, the computer 29 has for example an operating unit 31, a display 32, a memory 33, and a CPU 34 all connected via a bus 30.

The operating unit 31 is an operating means such as a keyboard or a mouse and outputs an operating signal in accordance with operations by the user to the CPU 34. The display 32 displays a screen corresponding to the processing of the circuit design by the CPU 34.

The memory 33 stores a program 41 (program of the present invention) and data 42 used for the processing of the CPU 34.

The CPU 34 executes the program 41 and designs the a-times multiprocessing circuit on the finite field K in the processing circuit on the finite field L as shown below by using the data 42.

The CPU 34 corresponds to the first to fourth means of the circuit design apparatus of the present invention.

Figure 5:
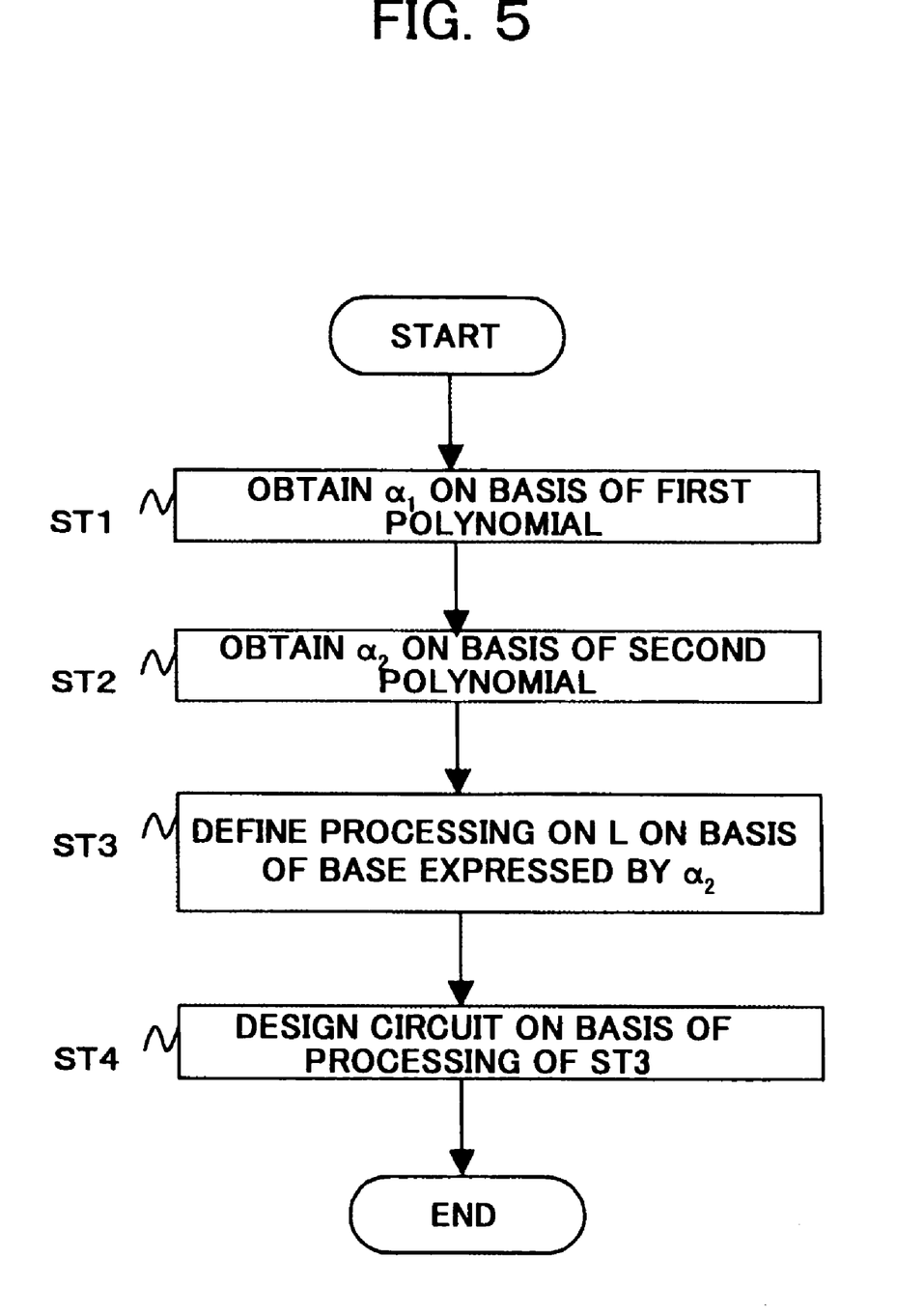
FIG. 5 is a view for explaining processing of the computer shown in FIG. 4.

FIG. 5 is a flow chart for explaining an example of the operation in the case where the CPU 34 designs the multiplier circuits in the processing circuit 2.

Step ST1

The CPU 34 obtains the first primitive root $\alpha_1$ on the basis of the first polynomial shown in the above (2-4) for the first extension from the finite field F to the finite field K.

Step ST2

The CPU 34 obtains above second primitive root $\alpha_2$ on the basis of the second polynomial shown in the above (2-5) in which the coefficient "a" of the 0-th term is defined by using the first primitive root $\alpha_1$ obtained at step ST1 and the coefficient of the 0-th term of the first polynomial.

Step ST3

The CPU 34 defines the processing on the finite field L by using the base expressed by using the above primitive root $\alpha_2$ obtained at step ST2.

Then, when there is a-times multiprocessing on the finite field K in the processing on the finite field L, the a-times multiprocessing is defined on the basis of the above (2-10) and (2-11). At this time, on the basis of above (3-12), the q-th term of $\alpha_1$ in the above (2-10) is replaced by the coefficients "c" of the first and 0-th terms to define the related a-times multiprocessing. By this, the above a-times multiprocessing is defined by processing for the coefficients of the less than q-th terms of $\alpha_1$.

Step ST4

The CPU 34 designs the processing circuit for the above processing on the finite field L including the a-times multiprocessing circuit on the above finite field K on the basis of the processing defined at step ST3.

Figure 6:
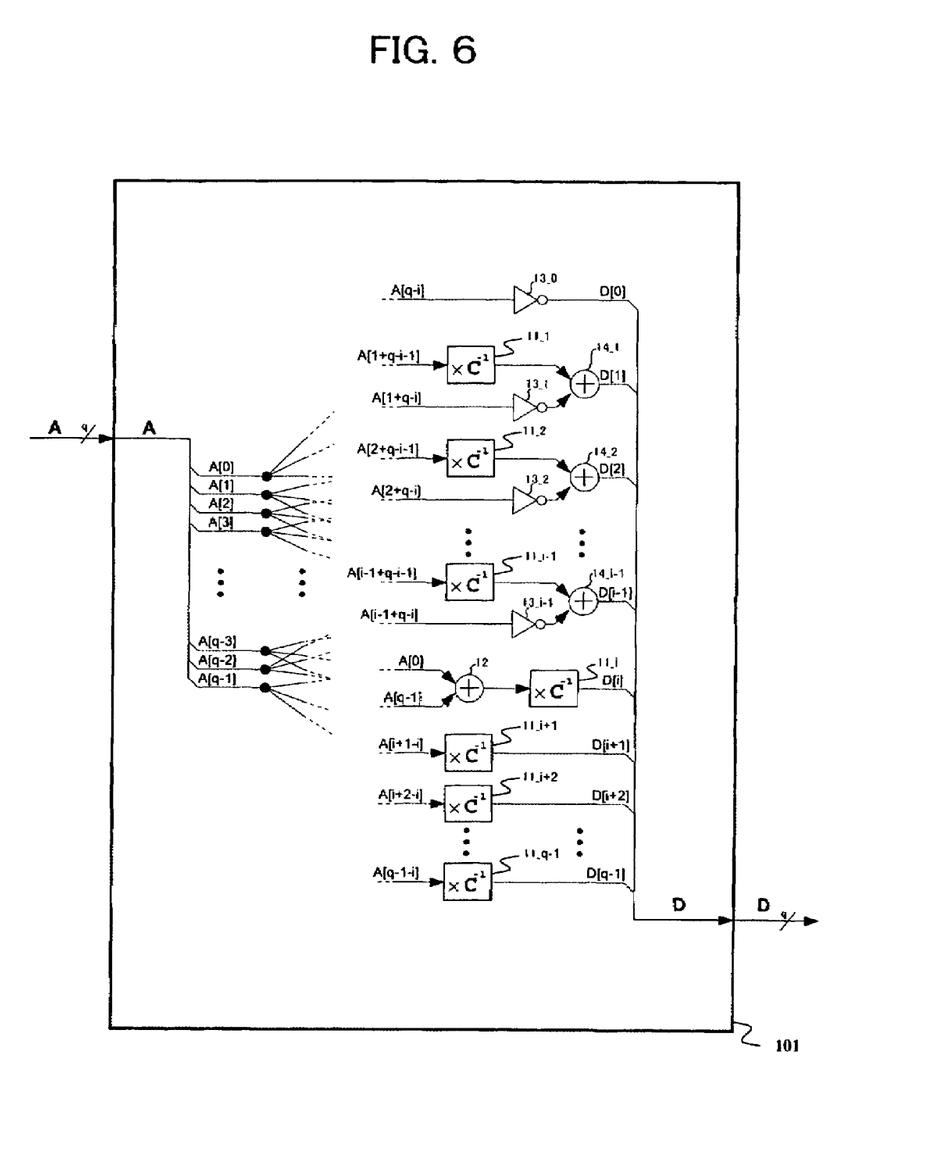
FIG. 6 is a view of the configuration of the a-times multiprocessing circuit on the finite field K shown in FIG. 3.

In the present embodiment, for example, the a-times multiprocessing circuit 101 on the finite field K shown in FIG. 3 is designed as shown in FIG. 6.

Namely, the a-times multiprocessing circuit 101 is designed so that the CPU 34 receives as input the q-th dimensional vector VA shown in the above (2-7).

A[0] to A[q−1] shown in FIG. 6 correspond to $A_0$ to $A_{q-1}$ shown in the above (2-7).

Further, as shown in FIG. 6, the CPU 34 designs the a-times multiprocessing circuit 101 so that the data A[0] to A[q−1] are input to the corresponding circuits among the inverters 13_0 to 13_i−1, $c^{-1}$-multiprocessing circuits 11_1 to 11_i−1, and $c^{-1}$-multiprocessing circuits 11_i+1 to 11_q−1 for the $c^{-1}$-multiprocessing, and the adder circuit 12.

Further, the CPU 34 designs the a-times multiprocessing circuit 101 so that the outputs of the $c^{-1}$-multiprocessing circuits 11_1 to 11_i−1 are input to the adder circuits 14_1 to 14_i−1.

Further, the CPU 34 designs the a-times multiprocessing circuit 101 so that the outputs of the inverters 13_1 to 13_i−1 are input to the adder circuits 14_1 to 14_i−1.

Further, the CPU 34 designs the a-times multiprocessing circuit 101 so that the output of the adder circuit 12 is input to the $c^{-1}$-multiprocessing circuit 11_i.

Then, the CPU 34 designs the a-times multiprocessing circuit 101 so that the outputs of the inverter 13_0, adder circuits 14_1 to 14_i−1, and $c_{-1}$-multiprocessing circuits 11_i to 11_q−1 become the data D[0] to D[q−1].

D[0] to D[q−1] shown in FIG. 6 correspond to $D_0$ to $D_{q-1}$ shown in the above (2-9) and (2-11).

As explained above, according to the circuit design method of the present embodiment, as shown in the above (2-5), by defining the coefficient "a" of the 0-th term of the second polynomial by using the first primitive root $\alpha_1$ of the first polynomial shown in the above (2-4) and the coefficient c of the 0-th term of the related first polynomial, the a-times multiprocessing circuit 101 shown in FIG. 6 having a decreased number of circuit elements and reduced size in comparison with the a-times multiprocessing circuit 301 shown in FIG. 2 can be designed. In the conventional a-times multiprocessing circuit 301 shown in FIG. 2, the circuit for performing the multiplication concerned with the coefficient "c", shown in the above (1-4) and the coefficient "d" shown in the above (1-5) was needed as the X-multiprocessing circuit, but in the a-times multiprocessing circuit 101, the X-multiprocessing circuit becomes only the circuit concerned with the coefficient "c".

The present invention is not limited to the above embodiment.

For example, in the above (2-4) and (2-5), when q=2 and n=4, the first finite field F is shown by the following (3-1), and the above (2-4) and (2-5) are shown by the following (3-2) and (3-3):

$$F=F_2(\gamma), \gamma^4+\gamma+1=0 \quad (3\text{-}1)$$

$$\alpha_1: \alpha_1^2+\alpha_1+c=0,\ c=\gamma^3 \quad (3\text{-}2)$$

$$\alpha_2: \alpha_2^2+\alpha_2+a=0,\ a=\gamma^{-3}\cdot\alpha_1 \quad (3\text{-}3)$$

Further, in the above embodiment, the case of designing a processing circuit on the finite field L including the a-times multiprocessing circuit on the finite field K was illustrated, but the present invention can also design a processing circuit on the finite field L including a multiplier circuit on the finite field K and an inverse element generation circuit.

Summarizing the effects of the invention, according to the present invention, it is possible to provide a circuit design method, apparatus, and program able to design a processing circuit for processing on a finite field with fewer circuit design elements and in a smaller size than the past and such a processing circuit.

While the invention has been described with reference to specific embodiments chosen for purpose of illustration, it should be apparent that numerous modifications could be made thereto by those skilled in the art without departing from the basic concept and scope of the invention.

The invention claimed is:

1. A circuit design method executed by a computer for designing a processing circuit for processing on a finite field, the method comprising:
    a first step of obtaining a first primitive root $\alpha_1$ on the basis of a first polynomial for a first extension from a first finite field to a second finite field, the first polynomial having a 0-th term;
    a second step of obtaining a second primitive root $\alpha_2$ on the basis of a second polynomial for a second extension from said second finite field to a third finite field, in which a coefficient of the 0-th term of the second polynomial is defined using said first primitive root $\alpha_1$ and the coefficient of the 0-th term of said first polynomial;
    a third step of defining the processing on said third finite field using a base expressed using said second primitive root $\alpha_2$; and
    a fourth step of designing a processing circuit for the related processing on the basis of the processing defined in said third step.

2. A circuit design method as set forth in claim 1, further comprising:
    defining processing on said third finite field using processing on said second finite field in said third step and designing a first processing circuit for processing on said second finite field used in said third step and designing a second processing circuit for processing on said third finite field using said first processing circuit.

3. A circuit design method as set forth in claim 2, further comprising defining processing on said third finite field using processing on said second finite field multiplying a coefficient of the 0-th term of said second polynomial in said third step.

4. A circuit design method executed by a computer for designing a processing circuit for processing on a finite field, the method comprising:
    a first step of obtaining a first primitive root $\alpha_1$ on the basis of a first polynomial for a first extension from a first finite field to a second finite field, the first polynomial having a 0-th term;
    a second step of obtaining a second primitive root $\alpha_2$, on the basis of a second polynomial for a second extension from said second finite field to a third finite field, in which a coefficient of the 0-th term of the second polynomial is defined using said first primitive root and the coefficient of the 0-th term of said first polynomial;
    a third step of defining the processing on said third finite field using a base expressed using said second primitive root $\alpha_2$; and
    a fourth step of designing a processing circuit for the related processing on the basis of the processing defined in said third step;
wherein when:
    said first finite field is an extension of an extension order n from a finite set $F_q$,
    said second finite field is a first extension of an extension order $l_1$ from said first finite field,
    said third finite field is a second extension of an extension order $l_2$ from said second finite field, and
    defining the processing on said third finite field shown by the following (1-2) of the order shown by the following (1-1) in the third step, the method obtains said first primitive root $\alpha_1$ on the basis of the following (1-3) in the first step and
    obtains said second primitive root $\alpha_2$ on the basis of the following (1-4) in the second step:

$$q^{n \cdot l_1 \cdot l_2}\ (q=p^m,\ p: \text{prime number},\ n,\ l_1,\ l_2,\ m: \text{natural numbers}) \quad (1\text{-}1)$$

$$L:=F_{q^{n \cdot l_1 \cdot l_2}} \quad (1\text{-}2)$$

$$\alpha_1: \alpha_1^{l_1}-\alpha_1+c=0,\ X^{l_1}-X+c \in F[X],\ I.\ \text{Irreducible} \quad (1\text{-}3)$$

$$\alpha_2: \alpha_2^{l_2}-\alpha_2+a=0,\ a=c^{-1}\cdot\alpha_1^{i}\cdot\exists i\in Z,\ s.t. X^{l_2}-X+a\in K[X],\ \text{Irreducible} \quad (1\text{-}4)$$

5. A circuit design method as set forth in claim 4, wherein, when said extension orders $l_1$ and $l_2$ are both q, the method obtains said first primitive root $\alpha_1$ on the basis of the following (1-5), (1-5a) in the first step and obtains said second primitive root $\alpha_2$ on the basis of the following (1-6) in the second step:

$$\alpha_1: \alpha_1^q-\alpha_1+c=0,\ \exists c\in Fs.t. Tr_{F_q}^F(c)\neq 0 \quad (1\text{-}5)$$

$$Tr_{F_q}^F(c):=c+c^q+c^{q^2}\ c^{q^3}+\ldots+c^{q^{n-1}} \quad (1\text{-}5a)$$

$$\alpha_2: \alpha_2^q-\alpha_2+a=0,\ \exists a=c^{-1}\cdot\alpha_1^{i}\in K,\ i\in Zs.t. Tr_{F_q}^{K(\alpha_1^{i})}\neq 0, \quad (1\text{-}6)$$

6. A circuit design apparatus for designing a processing circuit for processing on a finite field, the circuit design apparatus comprising:
    a first means for obtaining a first primitive root $\alpha_1$ on the basis of a first polynomial for a first extension from a first finite field to a second finite field, the first polynomial having a 0-th term;
    a second means for obtaining a second primitive root $\alpha_2$ on the basis of a second polynomial for a second extension from said second finite field to a third finite field, in which a coefficient of the 0-th term of the second polynomial is defined using said first primitive root $\alpha 1$ obtained by said first means and the coefficient of the 0-th term of said first polynomial;
    a third means for defining processing on said third finite field using a base expressed using said second primitive root $\alpha_2$ obtained by said second means; and fourth means for designing a processing circuit for the related processing on the basis of the processing defined by said third means.

7. A program executed by a circuit design apparatus for designing a processing circuit for processing on a finite field comprising:

a first routine of obtaining a first primitive root $\alpha_1$ on the basis of a first polynomial for a first extension from a first finite field to a second finite field, the first polynomial having a 0-th term;

a second routine of obtaining a second primitive root $\alpha_2$ on the basis of a second polynomial for a second extension from said second finite field to a third finite field, in which a coefficient of the 0-th term of the second polynomial is defined using said first primitive root $\alpha_1$ and the coefficient of the 0-th term of said first polynomial;

a third routine of defining processing on said third finite field using a base expressed using said second primitive root $\alpha_2$; and a fourth routine of designing a processing circuit for the related processing on the basis of the processing defined in said third routine.

* * * * *